(12) United States Patent
Strassner et al.

(10) Patent No.: US 11,545,375 B2
(45) Date of Patent: Jan. 3, 2023

(54) HYBRID CONTROL SYSTEM FOR WORKPIECE HEATING

(71) Applicant: Applied Materials, Inc., Santa Clara, CA (US)

(72) Inventors: James D. Strassner, Austin, TX (US); Bradley M. Pomerleau, Beverly, MA (US); D. Jeffrey Lischer, Acton, MA (US); Dawei Sun, Lynnfield, MA (US); Michael Paul Rohrer, Cedar Park, TX (US)

(73) Assignee: Applied Materials, Inc., Santa Clara, CA (US)

( * ) Notice: Subject to any disclaimer, the term of this patent is extended or adjusted under 35 U.S.C. 154(b) by 844 days.

(21) Appl. No.: 16/443,043

(22) Filed: Jun. 17, 2019

(65) Prior Publication Data

US 2020/0395233 A1     Dec. 17, 2020

(51) Int. Cl.
| | |
|---|---|
| *H01L 21/67* | (2006.01) |
| *H01L 21/02* | (2006.01) |
| *G05D 23/02* | (2006.01) |
| *G05D 23/19* | (2006.01) |

(52) U.S. Cl.
CPC ....... *H01L 21/67248* (2013.01); *G05D 23/02* (2013.01); *G05D 23/1904* (2013.01); *H01L 21/02* (2013.01)

(58) Field of Classification Search
CPC .... G05D 23/02; G05D 23/1904; H01L 21/02; H01L 21/67115; H01L 21/67248
See application file for complete search history.

(56) References Cited

U.S. PATENT DOCUMENTS

| | | | |
|---|---|---|---|
| 6,204,484 B1* | 3/2001 | Tay | ......................... C30B 25/16 118/725 |
| 8,052,419 B1* | 11/2011 | Nordin | .............. H01L 21/67248 432/247 |
| 9,418,881 B2 | 8/2016 | Sugiura et al. | |

(Continued)

FOREIGN PATENT DOCUMENTS

| | | |
|---|---|---|
| JP | 2016-6824 A | 1/2016 |
| TW | 201504605 A | 2/2015 |

(Continued)

OTHER PUBLICATIONS

International Search Report and Written Opinion dated Sep. 1, 2020 in corresponding PCT application No. PCT/JS2020/033603.

*Primary Examiner* — Kidest Bahta
(74) *Attorney, Agent, or Firm* — Nields, Lemack & Frame, LLC

(57) ABSTRACT

A system and method of heating a workpiece to a desired temperature is disclosed. This system and method consider the physical limitations of the temperature device, such as time lag, temperature offset, and calibration, in creating a hybrid approach that heats the workpiece more efficiently. First, the workpiece is heated using open loop control to heat the workpiece to a threshold temperature. After the threshold temperature is reach, a closed loop maintenance mode is utilized. In certain embodiments, an open loop maintenance mode is employed between the open loop warmup mode and the closed loop maintenance mode. Additionally, a method of calibrating a pyrometer using a contact thermocouple is also disclosed.

20 Claims, 7 Drawing Sheets

(56) References Cited

U.S. PATENT DOCUMENTS

| | | |
|---|---|---|
| 2004/0195737 A1 | 10/2004 | Storm et al. |
| 2007/0238202 A1* | 10/2007 | Ranish .................... H01L 22/12 257/E21.53 |
| 2010/0054720 A1* | 3/2010 | Hunter .............. H01L 21/67248 392/416 |
| 2014/0269837 A1 | 9/2014 | Durland et al. |
| 2018/0053636 A1* | 2/2018 | Criminale ......... H01J 37/32724 |
| 2018/0053666 A1 | 2/2018 | Babayan et al. |

FOREIGN PATENT DOCUMENTS

| | | |
|---|---|---|
| TW | 201818473 A | 5/2018 |
| WO | 99/23690 A1 | 5/1999 |
| WO | 2004/001840 A1 | 12/2003 |

* cited by examiner

HYBRID CONTROL SYSTEM FOR WORKPIECE HEATING

FIELD

Embodiments of the present disclosure relate to system for heating a substrate, and more particularly, for heating a substrate efficiently to a desired temperature.

BACKGROUND

The fabrication of a semiconductor device involves a plurality of discrete and complex processes. The semiconductor substrate typically undergoes many processes during the fabrication process. These processes may occur in a processing chamber, which may be maintained at a different processing condition than the environment.

Heating substrates before and/or after processing is common in many semiconductor fabrication processes. In many cases, the substrate is heated to an elevated temperature. This preheating may help prevent substrate warping, popping and movement when the cold substrate contacts the hot platen. These phenomena may cause the creation of particles and mishandling, and may reduce overall process yield.

Additionally, in some embodiments, a substrate may be warmed after being subjected to a cold process to eliminate the possibility of condensation when the substrate exits the processing chamber.

The ability to heat a workpiece to a particular temperature is not trivial. Typically, there are two techniques that are used to measure the temperature of a workpiece.

The first technique is to use of contact thermocouples that are pressed against the workpiece. The thermocouple measures the temperature of the workpiece. However, there are three drawbacks associated with this method. First, the thermocouple may not record the actual temperature of the workpiece. For example, there may not be perfect thermal conductance between the workpiece and the thermocouple. Thus, the temperature measured by the thermocouple may not be accurate. Second, the thermocouple may have a time lag. For example, as the temperature of the workpiece changes, there is a delay before the thermocouple measures this change in temperature. Third, a calibration workpiece with permanently attached thermocouples is needed for every new type of workpiece that has a new coating, because the coating changes the emissivity. This is to ensure accurate temperature readings for that particular workpiece and coating combination. This is a very expensive and time consuming process.

The second technique is to use a pyrometer or other infrared sensor to measure the temperature of the workpiece remotely. However, temperature measurements using infrared may be inaccurate because the emissivity of silicon changes as a function of temperature. In other words, if the pyrometer is calibrated at a particular temperature, readings at temperature that are not close to the calibration temperature will be erroneous.

Thus, both measurement techniques are problematic when attempting to heat a workpiece from a first temperature, such as room temperature, to a second higher temperature. The temperature offset and time lag of contact thermocouples may make it difficult to control the heating source so that the workpiece reaches the desired temperature. The changing emissivity of silicon makes temperature measurements over a wide temperature range using a pyrometer difficult if not impossible.

Therefore, it would be beneficial if there were a control system to accurately heat a workpiece without utilizing a calibration workpiece with permanently attached thermocouples. Further, it would be advantageous if the control system operates using either a contact thermocouple and/or a pyrometer.

SUMMARY

A system and method of heating a workpiece to a desired temperature is disclosed. This system and method consider the physical limitations of the temperature device, such as time lag, temperature offset, and calibration, in creating a hybrid approach that heats the workpiece more efficiently. First, the workpiece is heated using open loop control to heat the workpiece to a threshold temperature. After the threshold temperature is reached, a closed loop maintenance mode is utilized. In certain embodiments, an open loop maintenance mode is employed between the open loop warmup mode and the closed loop maintenance mode. Additionally, a method of calibrating a pyrometer using a contact thermocouple is also disclosed.

According to one embodiment, a system for controlling a temperature of a workpiece is disclosed. The system comprises a temperature sensor; a heating element; and a controller, in communication with the temperature sensor and the heating element, wherein the controller comprises a processing unit and a memory device, wherein the memory device comprises instructions, which when executed by the processing unit, enable the controller to: operate in an open loop warmup mode, wherein the controller uses open loop control to heat the workpiece until a threshold temperature is reached; and operate in closed loop maintenance mode, wherein the controller uses closed loop control to maintain the temperature of the workpiece at a target temperature. In certain embodiments, the temperature sensor has a time lag, and the memory device further comprises instructions, which when executed by the processing unit, enable the controller to: operate in an open loop maintenance mode after the threshold temperature is reached, wherein the controller uses open loop control to roughly maintain the temperature of the workpiece; and switch from open loop maintenance mode to the closed loop maintenance mode after a time duration. In some embodiments, the time duration is at least as long as the time lag. In certain embodiments, the threshold temperature is selected such that the temperature of the workpiece does not exceed the target temperature during the open loop warmup mode. In certain embodiments, operating in the closed loop maintenance mode comprises: sampling an output of the temperature sensor; correcting for a temperature offset, if any, of the temperature sensor; compensating for a time lag, if any, of the temperature sensor; and using a corrected and compensated output of the temperature sensor as an input to a proportional-integral-derivative control loop to determine an output to the heating element. In some embodiments, compensating for the time lag comprises utilizing an inverse low pass filter, wherein a time constant of the inverse low pass filter is equal to the time lag of the temperature sensor. In certain embodiments, the temperature sensor comprises a contact thermocouple. In certain embodiments, the temperature sensor comprises a pyrometer.

According to another embodiment, a method of heating a workpiece to a target temperature is disclosed. The method comprises operating in an open loop warmup mode, wherein a controller uses open loop control to control a heating element until a threshold temperature is reached; and operating in a closed loop maintenance mode, wherein the controller uses closed loop control to maintain a temperature of the workpiece at the target temperature based on measurements from a temperature sensor. In certain embodiments, the method further comprises: operating in an open loop maintenance mode, wherein the controller uses open loop control to roughly maintain a temperature of the workpiece for a time duration before switching to the closed loop maintenance mode. In certain embodiments, the temperature sensor has a time lag, and the time duration is at least as long as the time lag. In certain embodiments, operating in closed loop maintenance mode comprises: sampling an output of the temperature sensor; correcting for a temperature offset, if any, of the temperature sensor; compensating for a time lag, if any, of the temperature sensor; and using a corrected and compensated output of the temperature sensor as an input to a proportional-integral-derivative control loop to determine an output to the heating element. In certain embodiments, compensating for the time lag comprises utilizing an inverse low pass filter, wherein a time constant of the inverse low pass filter is equal to the time lag of the temperature sensor. In certain embodiments, the temperature sensor comprises a pyrometer, and the method further comprises: calibrating the pyrometer, prior to the open loop warmup mode, using a contact thermocouple by: heating a workpiece to a known temperature as determined by the contact thermocouple; dwelling at the known temperature for a time duration greater than a time lag of the contact thermocouple; and correlating an output of the pyrometer to the known temperature determined by the contact thermocouple.

According to another embodiment, a non-transitory computer readable media, comprising instructions, which when executed by a controller, enable the controller to: operate in an open loop warmup mode, wherein the controller uses open loop control to heat a workpiece using a heating element until a threshold temperature is reached as measured by a temperature sensor; and operate in closed loop maintenance mode, wherein the controller uses closed loop control to maintain a temperature of the workpiece at a target temperature based on measurements by the temperature sensor. In certain embodiments, the temperature sensor has a time lag, and the non-transitory computer readable media further comprises instructions, which when executed by the controller, enable the controller to: operate in an open loop maintenance mode after the threshold temperature is reached, wherein the controller uses open loop control to roughly maintain the temperature of the workpiece; and switch from open loop maintenance mode to closed loop maintenance after a time duration. In certain embodiments, the time duration is at least as long as the time lag. In certain embodiments, the threshold temperature is selected such that the temperature of the workpiece does not exceed the target temperature during the open loop warmup mode. In certain embodiments, operating in the closed loop maintenance mode comprises: sampling an output of the temperature sensor; correcting for a temperature offset, if any, of the temperature sensor; compensating for a time lag, if any, of the temperature sensor; and using a corrected and compensated output of the temperature sensor as an input to a proportional-integral-derivative control loop to determine an output to the heating element. In certain embodiments, compensating for the time lag comprises utilizing an inverse low pass filter, wherein a time constant of the inverse low pass filter is equal to the time lag of the temperature sensor.

BRIEF DESCRIPTION OF THE FIGURES

For a better understanding of the present disclosure, reference is made to the accompanying drawings, which are incorporated herein by reference and in which.

DETAILED DESCRIPTION

As described above, in many applications, it is advantageous to preheat a substrate prior to that substrate being processed. Therefore, a system that can be used to heat substrates quickly would be beneficial.

Figure 1:
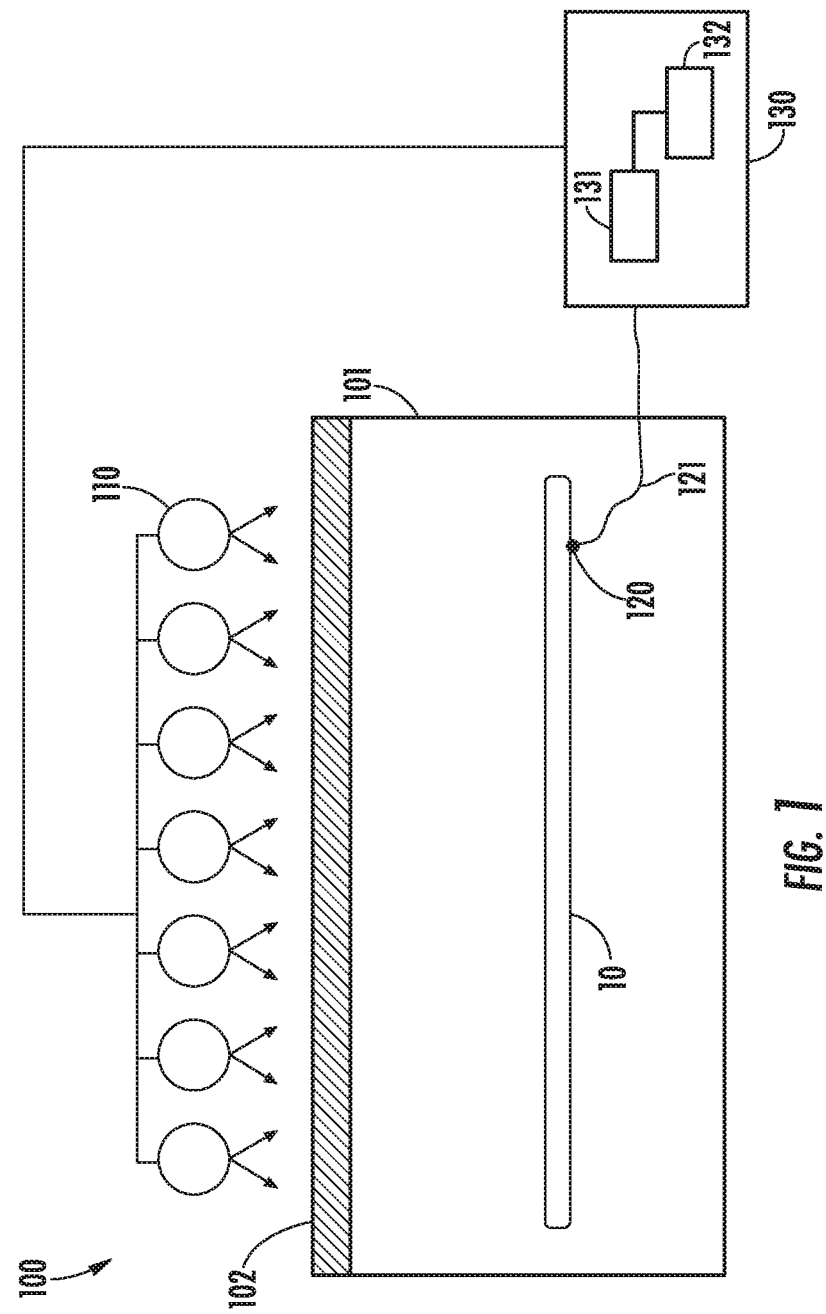
FIG. 1 is a processing chamber using a contact thermocouple to measure the temperature of a workpiece according to one embodiment.

FIG. 1 shows a side view of the substrate heating system 100 according to one embodiment. The substrate heating system 100 comprises a processing chamber 101, which may be maintained at near vacuum conditions, such as less than 100 mTorr. Outside the processing chamber 101 is a heating element 110. Light from the heating element 110 may pass through a window, such as a quartz window 102, which serves as one side of the processing chamber 101. This heating element 110 may be array of heating lamps. For example, tungsten halogen light bulbs may be used to emit energy toward the workpiece.

Power from tungsten halogen bulbs is emitted at wavelengths ranging from about 400 nm to 2600 nm, with the peak being at approximately 1000 nm. At wavelengths between 600 nm and 1800 nm, the emitted power is at least half the maximum emitted power.

In other embodiments, light emitting diodes (LEDs) may provide the thermal energy. In some instances, the LEDs are fabricated using gallium and nitrogen (GaN) or indium nitride and gallium nitride (InGaN). These LEDs emit light at a wavelength that is related to the bandgap energy between the p-type material and the n-type material. Thus, for LEDs fabricated using GaN and InGaN, the wavelengths tend to be about 450-500 nm.

The heating element 110 may be disposed above the workpiece 10, as shown in FIG. 1, or may be disposed beneath the workpiece 10. Thus, the position of the heating element 110 is not limited by this disclosure.

A controller 130 may be disposed outside the processing chamber 101. This controller 130 includes a processing unit 131 and a memory device 132. The processing unit 131 may be any suitable component, such as a microprocessor, embedded processor, an application specific circuit, a programmable circuit, a microcontroller, or another similar device. This memory device 132 contains the instructions, which, when executed by the processing unit 131, enable the controller 130 to perform the functions described herein.

This memory device 132 may be a non-volatile memory, such as a FLASH ROM, an electrically erasable ROM or other suitable devices. In other embodiments, the memory device 132 may be a volatile memory, such as a RAM or DRAM.

The controller 130 is in communication with the heating element 110. The controller may energize the heating element 110 and may also determine an amount of power to supply to the heating element 110. In other words, the controller 130 may determine an appropriate variable amount of power to supply to the heating element 110 to achieve a desired workpiece temperature.

A workpiece 10 is also disposed in the processing chamber 101, such as on a workpiece support. A contact thermocouple 120 may be in physical contact with the workpiece 10. The controller 130 is in electrical communication with the contact thermocouple 120 via electrical wires 121. Thus, the controller 130 is able to monitor the temperature of the workpiece 10 via the contact thermocouple 120.

Thus, the contact thermocouple 120, the controller 130 and the heating element 110 form a closed loop control system, where the controller 130 monitors the temperature of the workpiece 10 via the contact thermocouple 120 and adjusts the power to the heating elements 110 accordingly.

As described above, the contact thermocouple 120 may have two drawbacks; temperature offset and time lag. Thus, a calibration may be performed to correlate the temperature recorded by the contact thermocouple 120 with the actual temperature of the workpiece 10. For example, a workpiece may be placed in a processing chamber and heated to a known temperature. This workpiece may be a thermocouple workpiece, which is a workpiece with embedded thermocouples. The temperature measured by the contact thermocouple is then recorded. This may be performed at a plurality of temperatures so as to create a graph or table showing the measured temperature and the actual temperature of the workpiece. As disclosed above, the processing chamber 101 may have a quartz window 102. In this embodiment, the temperature of the quartz window 102 may serve as a proxy for the temperature within the processing chamber 101. In another embodiment, a device, such as a silicon coupon, may be disposed within the processing chamber 101. The temperature of the device may serve as a proxy for the temperature within the processing chamber 101. The calibration process may include the actual workpiece temperature, the temperature within the processing chamber 101, and the temperature measured by the contact thermocouple. Based on this data, a relationship can be determined. Thus, the actual temperature of the workpiece 10 may be determined based on the measurements received from the contact thermocouple 120 and optionally the temperature of the quartz window 102 in the processing chamber 101. In certain embodiments, characterization testing to determine temperature offset may be performed by the system vendor or the component supplier. In other words, the calibration technique described above may be performed separately and at a different time that the rest of the process described below.

The second issue associated with the contact thermocouple 120 is its time lag. It is estimated that the duration between the time that the workpiece 10 reaches a particular temperature and the time that the contact thermocouple detects that temperature may be several seconds. In certain embodiments, characterization testing to determine time lag of a particular contact thermocouple 120 may be performed by the system vendor or the component supplier. Thus, the actual time lag may be provided to the controller 130 that executes the method described below.

In other words, the contact thermocouple acts like a low pass filter, passing signals with a time delay. A low pass filter may be constructed digitally using the following equation:

$$S_{filtered,i} = (1-f) * S_{filtered,i-1} + f * S_{raw,i}$$

where $S_{raw,i}$ is the raw signal at time i
$S_{filtered,i}$ is the filtered signal at time i
$S_{filtered,i-1}$ is the filtered signal at time i−1, and $$f = T_{sample}/(T_{sample} + \tau_{filter}), \text{ where}$$

$T_{sample}$ is the data sampling time interval and
$\tau_{filter}$ is the time constant of the low pass filter.

This equation may be used to delay a signal by approximately $\tau_{filter}$.

The contact thermocouple 120 behaves as a low pass filter such that its measurements lag the actual temperature by a certain time delay. Thus, to recreate the original signal, one may create an inverse low pass filter, which restores the original signal based on the filtered signals. Solving the above equation for $S_{raw,i}$ yields the following:

$$S_{raw,i} = S_{filtered,i-1} + (S_{filtered,i} - S_{filtered,i-1})/f$$

Thus, by sampling the measurements at regular intervals, such as $T_{sample}$, and recording the measurements, the actual temperature of the workpiece 10 at the present time may be reconstructed using an inverted low pass filter.

This inverse low pass filter may introduce noise and therefore may be more accurate when there are small changes in temperature.

Having described a technique to negate the temperature offset and the time lag, a hybrid control system may be created to heat the workpiece 10.

Figure 2:
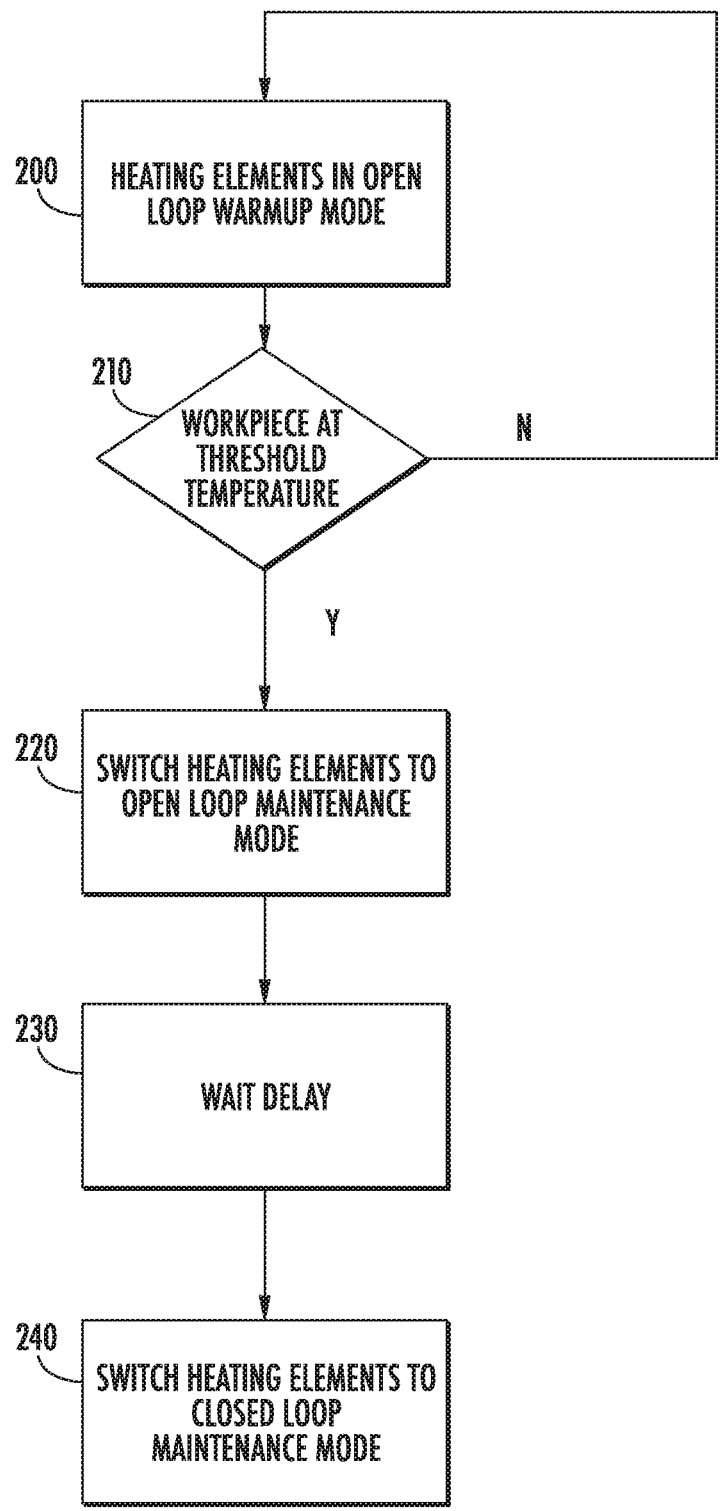
FIG. 2 is a flow chart showing the sequence used to heat a workpiece.

FIG. 2 shows a flowchart that may be used to heat a workpiece 10 in a controlled manner, using the system of FIG. 1. The controller 130 may execute the processes described in FIG. 2. This is shown graphically in FIG. 3. First, as shown in Process 200, the controller applies a first power level 330 to the heating element 110. This first power level 330 causes the workpiece 10 to heat the workpiece quickly, as shown by line 300 in FIG. 3. During the first time duration 320, the controller 130 operates in open loop mode, where the controller 130 applies the first power level 330 to the heating element 110 with no dependence on the temperature of the workpiece 10. The mode during the first time duration 320 may be referred to as the open loop warmup mode. As is well understood, open loop control implies that the temperature of the workpiece 10 does not affect the power being supplied to the heating element 110. Thus, in certain embodiments, in open loop warmup mode, the power applied to the heating element 110 may remain constant until the threshold temperature 310 is reached.

While the first power level 330 applied to the heating element 110 is not dependent on the temperature of the workpiece 10, the controller 130 does monitor the temperature of the workpiece 10 during the first time duration 320, using the contact thermocouple 120.

As shown in Process 210, as long as the temperature of the workpiece 10 has not reached a threshold temperature 310, the controller 130 remains in open loop warmup mode. Once the temperature of the workpiece 10 reaches the threshold temperature 310, the controller 130 exits open loop warmup mode.

In certain embodiments, the temperature of the workpiece 10 is measured using the contact thermocouple 120. In certain embodiments, the threshold temperature 310 is chosen based on the rate of temperature increase (i.e. the slope of line 300). In certain embodiments, the temperature offset of the contact thermocouple 120 is considered when determining the threshold temperature 310. In certain embodiments, the time lag of the contact thermocouple 120 is considered when determining the threshold temperature 310. In other embodiments, the threshold temperature 310 is determined empirically so as to achieve a fast preheat time without having the temperature of the workpiece 10 overshoot the target temperature 311. Thus, the threshold temperature 310 is less than the target temperature 311. For example, the threshold temperature 310 may be 20-30° C. less than the target temperature 311.

Figure 3:
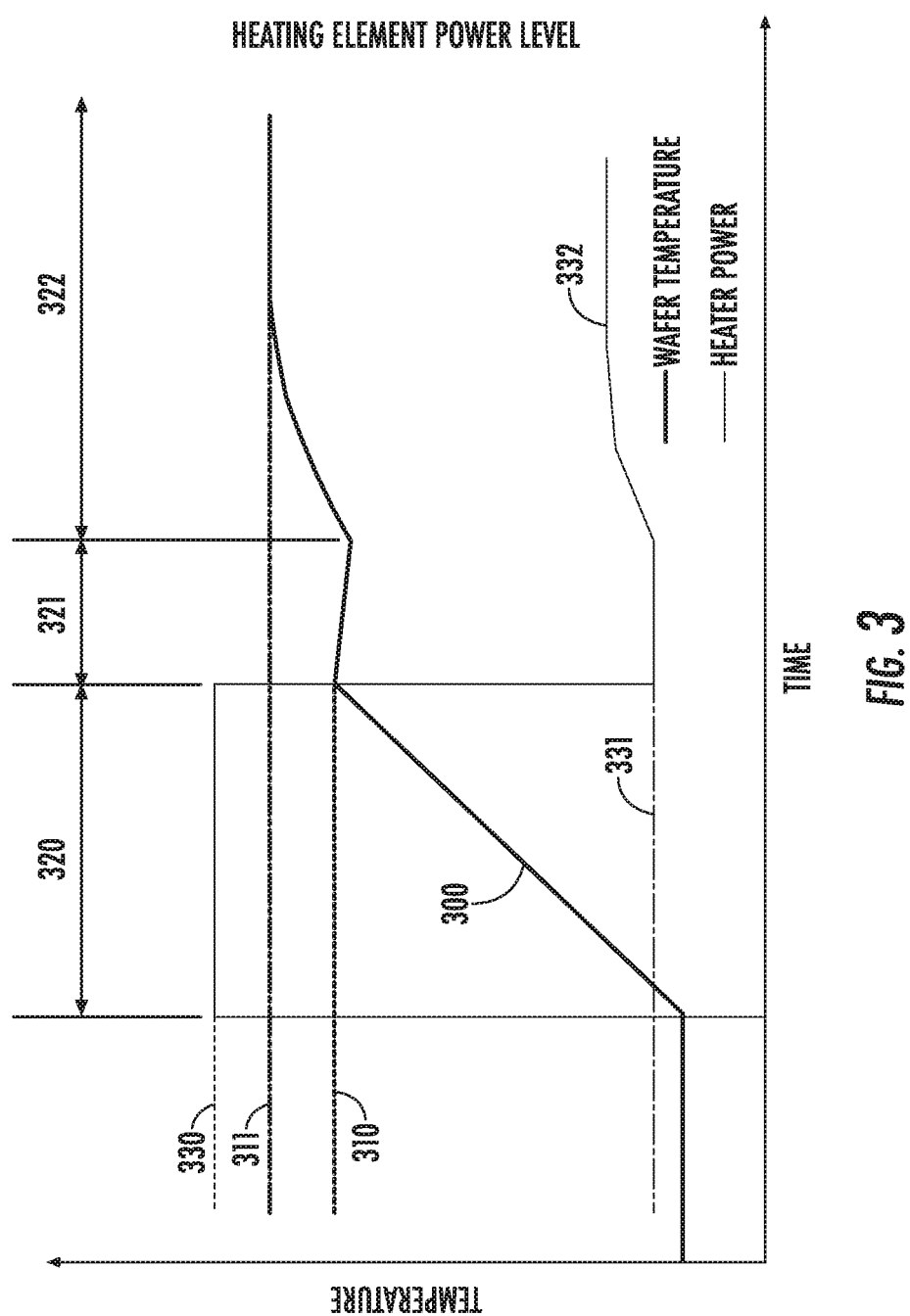
FIG. 3 is a graph showing temperature of a workpiece and the power applied to the heating element as a function of time.

When the controller 130 exits open loop warmup mode, it enters open loop maintenance mode, as shown in Process 220. In this mode, which has a second time duration 321, the controller 130 adjusts the power applied to the heating element 110 so as to attempt to maintain the temperature of the workpiece 10. A second power level 331 may be applied to the heating element 110 during the second time duration 321. This second power level 331 is less than the first power level 330. The second power level 331 may cause the temperature of the workpiece 10 to remain roughly at the threshold temperature 310, although the temperature of the workpiece may deviate from this threshold temperature 310, as shown in FIG. 3. The second power level 331 is selected to roughly maintain the temperature of the workpiece 10 until the second time duration 321 expires. The phrase "roughly maintain" denotes that the temperature of the workpiece may deviate by up to 20° C. from the threshold temperature 310. The second time duration 321 may be equal to, or greater than, the time lag of the contact thermocouple 120. As explained above, the time lag of the contact thermocouple 120 may be a parameter that is supplied to the controller 130, such as by the system vendor, or may be input to the controller 130 based on technical data. Thus, in one embodiment, the controller 130 applied the second power level 331, less than the first power level 330, during the entirety of the open loop maintenance mode, and keeps the second power level 331 constant during the second time duration 321.

In this way, the inverse low pass filter is operated using temperature values that are all fairly close to the target temperature 311. This may improve the accuracy of the inverse low pass filter. For example, in certain embodiments, the time lag of the contact thermocouple 120 may be about 2.7 seconds. Thus, in this embodiment, the wait delay, as shown in Process 230, may be at least 2.7 seconds.

Figure 4:
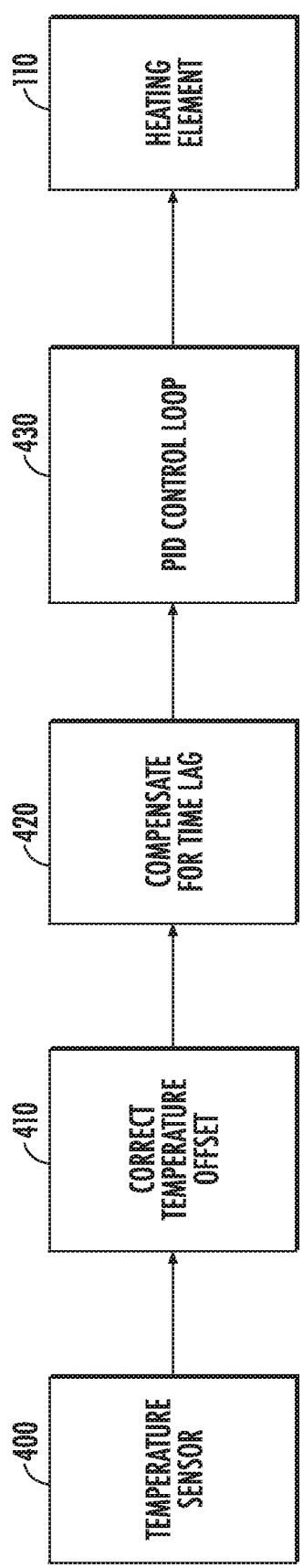
FIG. 4 shows the closed control loop that may be used in some embodiments.

After the wait delay, the controller 130 switches to closed loop maintenance mode, as shown in Process 240. The closed loop maintenance mode has a third time duration 322, as shown in FIG. 3. In this mode, controller 130 uses the measurements from the contact thermocouple 120 to determine the power level 332 to apply to the heating element 110. As is well understood, closed loop control implies that the power supplied to the heating element 110 is dependent on the temperature of the workpiece 10. A representative closed loop process is shown in FIG. 4.

First, a signal from the temperature sensor 400 is sampled. The temperature sensor 400 may be a contact thermocouple 120 as described above, or a pyrometer as described below. Next, as shown in Process 410, the temperature offset that is inherent in the temperature sensor reading is corrected. This may be achieved by adding a constant to the sampled reading. In another embodiment, this may be achieved through the use of a look-up table or an equation that converts measured temperature to actual temperature.

Again, the algorithm to correct the temperature offset may be provided by the system provider or by another method. Once the temperature value has been corrected, the time lag that may be inherent in the temperature sensor 400 is compensated for, as shown in Process 420. As described above, this may be achieved using an inverse low pass filter having a time constant that is equal to the time lag of the temperature sensor 400. The output of the inverse low pass filter represents the actual temperature of the workpiece 10 at the current time. This value is then used as an input to a Proportional-Integral-Derivative (PID) control loop, as shown in Process 430. The output of the PID control loop is used to apply an appropriate amount of power to the heating element 110. In this way, the temperature of the workpiece 10 may be tightly controlled.

Because the controller 130 uses both open loop control, such as during first time duration 320 and closed loop control, such as during third time duration 322, this approach may be referred to as a hybrid control system.

Figure 5:
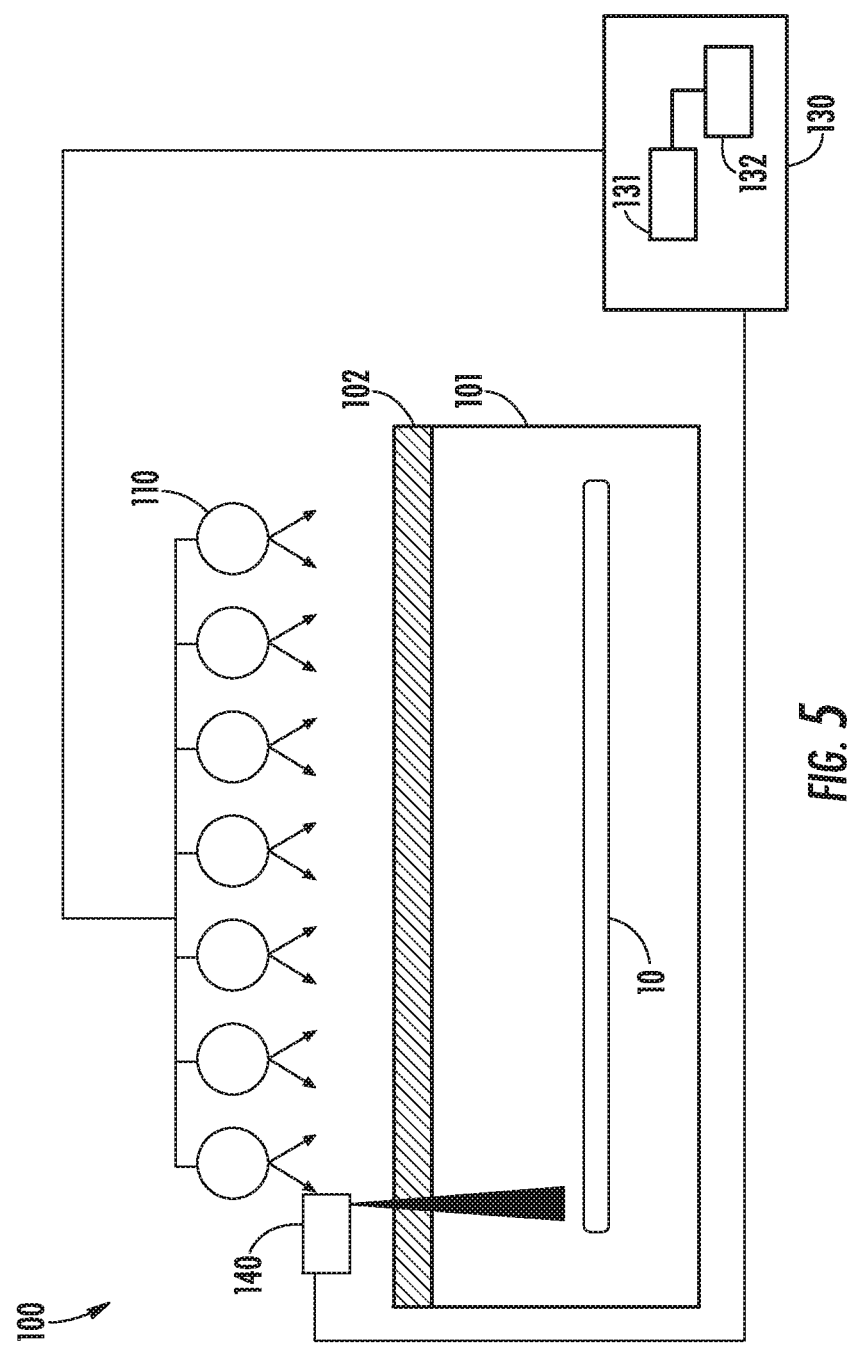
FIG. 5 is a processing chamber using a pyrometer to measure the temperature of a workpiece according to one embodiment.

FIG. 5 shows an embodiment where a pyrometer 140 is used to measure the temperature the workpiece 10. In this embodiment, the contact thermocouple 120 is replaced by the pyrometer 140. The pyrometer 140 may be disposed outside the processing chamber 101 and may emit light into the processing chamber 101 through a window. A pyrometer 140 has limitations when used to determine the temperature of a silicon wafer. The optical properties of silicon make the use of infrared techniques to measure the absolute temperature of a workpiece difficult. Emissivity is a measure of a material's ability to emit energy via radiation. At certain temperatures, silicon emissivity changes rapidly and this makes the use of infrared imaging an unstable technique to accurately measure the absolute temperature. At certain temperatures, the emissivity of silicon is nearly zero. As the temperature of the silicon increases, the emissivity of the silicon also increases. At 800° C., the emissivity of silicon is nearly constant at close to 0.7.

Therefore, in order to use a pyrometer 140, the pyrometer 140 is calibrated at the desired temperature. In other words, a workpiece is heated to the desired temperature. For example, a workpiece may be placed in a processing chamber and heated to a known temperature. This workpiece may be a thermocouple workpiece, which is a workpiece with embedded thermocouples. The temperature measured by the pyrometer 140 is then recorded. This may be performed at a plurality of temperatures so as to create a graph or table showing the measured temperature and the actual temperature of the workpiece. Thus, at the desired temperature, the workpiece has a certain emissivity and the pyrometer 140 is calibrated to that emissivity.

Figure 6:
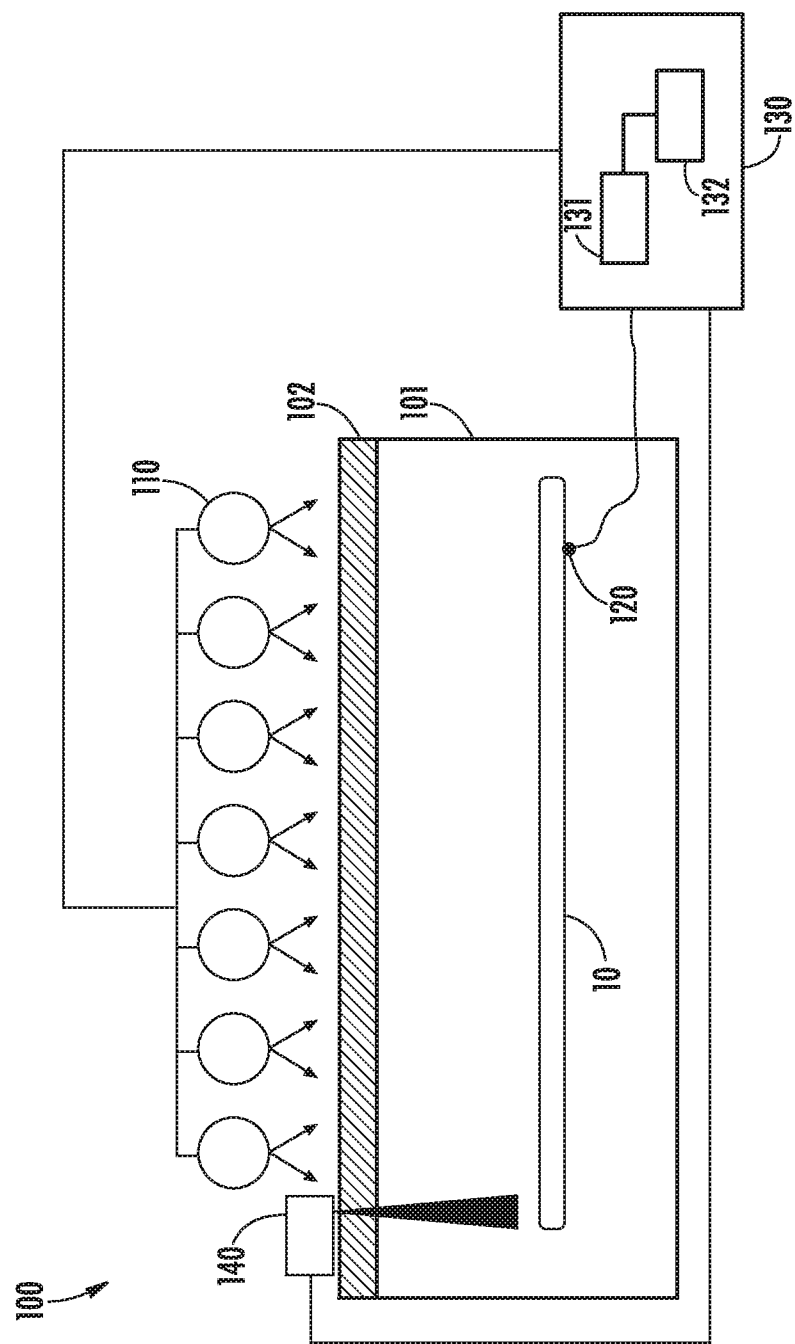
FIG. 6 is a processing chamber using a pyrometer and a contact thermocouple to calibrate the pyrometer according to one embodiment.
Figure 7:
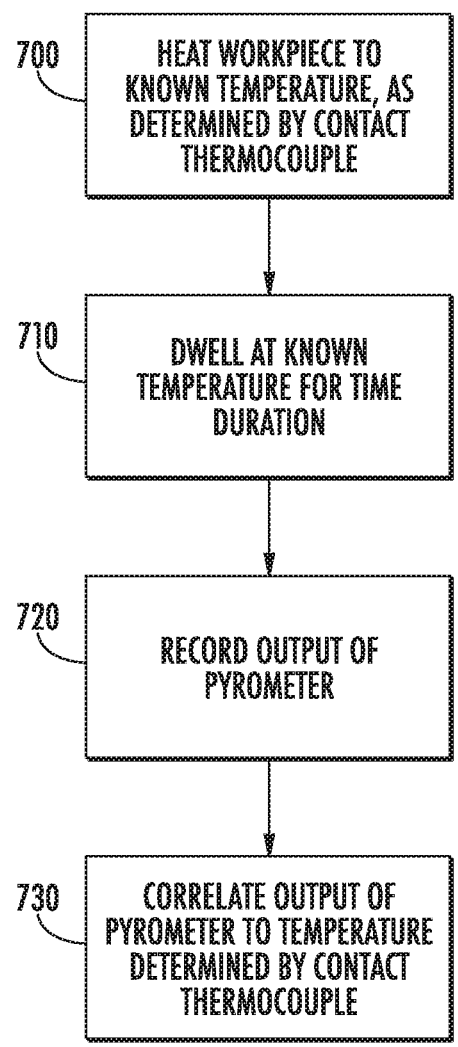
FIG. 7 is a flow chart showing the sequence to calibrate the pyrometer using a contact thermocouple.

FIG. 6 shows another embodiment that may be used to calibrate the pyrometer 140. Unlike the previous embodiment, the embodiment of FIG. 6 does not utilize a thermocouple workpiece. Thus, this embodiment may be more easily implemented by the customer or user of the system. In this embodiment, only the pyrometer 140 is utilized to control the workpiece temperature, while the contact thermocouple 120 is only utilized to calibrate the pyrometer 140. As described above, in order to use a pyrometer 140, the pyrometer 140 is calibrated at the desired temperature. This calibration process is shown in FIG. 7. First, as shown in Process 700, a workpiece 10 is heated to a known temperature. For example, a workpiece may be placed in a processing chamber and heated to a known temperature as defined by contact thermocouple 120. This known temperature may be the desired temperature that workpieces are to be heated to or may be a calibration temperature. Because the contact thermocouple 120 can be used to measure the temperature of the workpiece 10, a thermocouple workpiece is not utilized. As described above, the contact thermocouple 120 may have a temperature offset. This may be considered when determining that the workpiece is at the known temperature. Furthermore, because the contact thermocouple 120 has inherent response delays, the workpiece 10 is held at the known set point temperature for a sufficient time duration, as shown in Process 710. This time duration is included to ensure the time delay is nullified. For example, this time duration is equal to or greater than the time lag of the contact thermocouple 120. The temperature measured by the pyrometer 140 is then recorded, as shown in Process 720. This may be performed at a plurality of temperatures so as to create a graph or table showing the measured temperature and the actual temperature of the workpiece. The output of the pyrometer 140 is then correlated to the known temperature determined by the contact thermocouple, as shown in Process 730. Thus, at this known temperature, the workpiece has a certain emissivity and the pyrometer 140 is calibrated to that emissivity. Therefore, the pyrometer 140 is re-calibrated if a different workpiece with a new emissivity is utilized.

Once calibrated, the pyrometer 140 may be used to measure temperatures of the workpiece 10, but only near the calibrated temperature. In other words, the pyrometer 140 can be used to detect the threshold temperature 310 and during second time duration 321 and third time duration 322, but is ineffective at lower temperatures, such as those found during first time duration 320.

The pyrometer 140 differs from the contact thermocouple 120 in other ways as well. For example, unlike the contact thermocouple, the pyrometer 140 measures the instantaneous temperature of the workpiece 10. In other words, a pyrometer 140 has no time delay.

These characteristics make the sequence shown in FIG. 2 equally applicable to pyrometers. For example, because the pyrometer 140 cannot measure low temperatures, the open loop warmup mode, shown in Process 200, is used. In this embodiment, the threshold temperature is one at which the pyrometer may accurately measure the temperature of the workpiece 10. Once the threshold temperature is reached, the controller 130 switches to the open loop maintenance mode, as shown in Process 220.

The controller 130 remains in this mode for a wait delay, as shown in Process 230. However, in certain embodiments, the wait delay may be zero, or close to zero, since the pyrometer 140 does not have a time lag. The controller 130 then switches to closed loop maintenance mode, as shown in Process 240. Therefore, in certain embodiments, when using a pyrometer 140, the controller 130 moves from open loop warmup mode directly to closed loop maintenance mode when the threshold temperature 310 is reached.

Further, the closed control loop associated with the closed loop maintenance mode may differ from that shown in FIG. 4. Specifically, since the pyrometer 140 is calibrated to the desired temperature, the temperature offset correction, shown in Process 410 may be omitted. Similarly, since a pyrometer 140 has no time lag, the compensation for time lag, shown in Process 420, may also be omitted.

In other words, the output of the pyrometer 140 may be used directly as an input to the PID control loop, as shown in Process 430.

While the above disclosure described a system having a controller with instructions that enable it to perform the sequence shown in FIG. 2, other embodiments are also possible. For example, the instructions to perform these functions may be downloaded to an existing system. In other words, these instructions may be downloaded into the memory device 132, such as for example, over a network connection (not shown), via CD ROM, or by another mechanism. These instructions may be written in any programming language and is not limited by this disclosure. Thus, in some embodiments, there may be multiple computer readable media that contain the instructions described herein. The first computer readable media may be in communication with the processing unit 131, as shown in FIG. 1. The second non-transitory computer readable media may be a CDROM, or a different memory device, which is located remote from the controller 130. The instructions contained on this second non-transitory computer readable media may be downloaded onto the memory device 132 to allow execution of the instructions by the controller 130.

The embodiments described above in the present application may have many advantages. First, heating of a substrate prior to processing is a common semiconductor fabrication process. By creating a hybrid control system that employs both open loop and closed loop control, the time to reach the desired temperature may be minimized, improving throughput. Additionally, the use of closed loop control, which compensates for temperature offset and time lag, if any, allows the final temperature of the workpiece to be more tightly controlled. For example, in one test, this hybrid approach was compared to a conventional PID control loop, where the controller utilizes closed loop control throughout the entire heating process. In each test, the target temperature was 150° C. The conventional closed loop control approach resulted in the workpiece reaching the target temperature after 22 seconds. In contrast, the hybrid approach, which used open loop control during the warmup period before utilizing closed loop control, resulted in the workpiece reaching the target temperature in about 10 seconds. This dramatic reduction in heating time may increase throughput significantly.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A system for controlling a temperature of a workpiece, comprising:
    a temperature sensor;
    a heating element; and
    a controller, in communication with the temperature sensor and the heating element, wherein the controller comprises a processing unit and a memory device, wherein the memory device comprises instructions, which when executed by the processing unit, enable the controller to:

operate in an open loop warmup mode, wherein the controller uses open loop control to heat the workpiece until a threshold temperature is reached; and operate in closed loop maintenance mode, wherein the controller uses closed loop control to maintain the temperature of the workpiece at a target temperature, wherein the temperature sensor is used in both open loop warmup mode and closed loop maintenance mode.

2. The system of claim 1, wherein the temperature sensor has a time lag, wherein time lag is defined as a time between a change in the temperature of the workpiece and a time that the change in temperature is measured by the temperature sensor, and the memory device further comprises instructions, which when executed by the processing unit, enable the controller to:

operate in an open loop maintenance mode after the threshold temperature is reached, wherein the controller uses open loop control to roughly maintain the temperature of the workpiece, wherein the temperature of the workpiece may deviate from the threshold temperature by up to 20° C.; and switch from open loop maintenance mode to the closed loop maintenance mode after a time duration.

3. The system of claim 2, wherein the time duration is at least as long as the time lag.

4. The system of claim 1, wherein the threshold temperature is selected such that the temperature of the workpiece does not exceed the target temperature during the open loop warmup mode.

5. The system of claim 1, wherein operating in the closed loop maintenance mode comprises:

sampling an output of the temperature sensor;

correcting for a temperature offset, if any, of the temperature sensor;

compensating for a time lag, if any, of the temperature sensor wherein time lag is defined as a time between a change in the temperature of the workpiece and a time that the change in temperature is measured by the temperature sensor; and using a corrected and compensated output of the temperature sensor as an input to a proportional-integral-derivative control loop to determine an output to the heating element.

6. The system of claim 5, wherein the compensating for the time lag comprises utilizing an inverse low pass filter, wherein a time constant of the inverse low pass filter is equal to the time lag of the temperature sensor.

7. The system of claim 1, wherein the temperature sensor is a contact thermocouple.

8. The system of claim 1, wherein the temperature sensor is a pyrometer.

9. A method of heating a workpiece to a target temperature, comprising:

operating in an open loop warmup mode, wherein a controller uses open loop control to control a heating element until a threshold temperature is reached; and operating in a closed loop maintenance mode, wherein the controller uses closed loop control to maintain a temperature of the workpiece at the target temperature based on measurements from a temperature sensor, wherein the temperature sensor is also used in the open loop warmup mode.

10. The method of claim 9, further comprising:

operating in an open loop maintenance mode, wherein the controller uses open loop control to roughly maintain a temperature of the workpiece for a time duration before switching to the closed loop maintenance mode, wherein the temperature of the workpiece may deviate from the threshold temperature by up to 20° C.

11. The method of claim 10, wherein the temperature sensor has a time lag, wherein time lag is defined as a time between a change in the temperature of the workpiece and a time that the change in temperature is measured by the temperature sensor, and the time duration is at least as long as the time lag.

12. The method of claim 9, wherein operating in closed loop maintenance mode comprises:

sampling an output of the temperature sensor;

correcting for a temperature offset, if any, of the temperature sensor;

compensating for a time lag, if any, of the temperature sensor wherein time lag is defined as a time between a change in the temperature of the workpiece and a time that the change in temperature is measured by the temperature sensor; and using a corrected and compensated output of the temperature sensor as an input to a proportional-integral-derivative control loop to determine an output to the heating element.

13. The method of claim 12, wherein the compensating for the time lag comprises utilizing an inverse low pass filter, wherein a time constant of the inverse low pass filter is equal to the time lag of the temperature sensor.

14. The method of claim 9, wherein the temperature sensor comprises a pyrometer, the method further comprising:

calibrating the pyrometer, prior to the open loop warmup mode, using a contact thermocouple by:

heating a workpiece to a known temperature as determined by the contact thermocouple;

dwelling at the known temperature for a time duration greater than a time lag of the contact thermocouple wherein time lag is defined as a time between a change in the temperature of the workpiece and a time that the change in temperature is measured by the contact thermocouple; and correlating an output of the pyrometer to the known temperature determined by the contact thermocouple.

15. A non-transitory computer readable media, comprising instructions, which when executed by a controller, enable the controller to:

operate in an open loop warmup mode, wherein the controller uses open loop control to heat a workpiece using a heating element until a threshold temperature is reached as measured by a temperature sensor; and operate in closed loop maintenance mode, wherein the controller uses closed loop control to maintain a temperature of the workpiece at a target temperature based on measurements by the temperature sensor.

16. The non-transitory computer readable media of claim 15, wherein the temperature sensor has a time lag, wherein time lag is defined as a time between a change in the temperature of the workpiece and a time that the change in temperature is measured by the temperature sensor, and the non-transitory computer readable media further comprises instructions, which when executed by the controller, enable the controller to:

operate in an open loop maintenance mode after the threshold temperature is reached, wherein the controller uses open loop control to roughly maintain the temperature of the workpiece, wherein the temperature of the workpiece may deviate from the threshold temperature by up to 20° C.; and switch from open loop maintenance mode to closed loop maintenance after a time duration.

17. The non-transitory computer readable media of claim 16, wherein the time duration is at least as long as the time lag.

18. The non-transitory computer readable media of claim 15, wherein the threshold temperature is selected such that the temperature of the workpiece does not exceed the target temperature during the open loop warmup mode.

19. The non-transitory computer readable media of claim 15, wherein operating in the closed loop maintenance mode comprises:
   sampling an output of the temperature sensor;
   correcting for a temperature offset, if any, of the temperature sensor;
   compensating for a time lag, if any, of the temperature sensor wherein time lag is defined as a time between a change in the temperature of the workpiece and a time that the change in temperature is measured by the temperature sensor; and
   using a corrected and compensated output of the temperature sensor as an input to a proportional-integral-derivative control loop to determine an output to the heating element.

20. The non-transitory computer readable media of claim 19, wherein the compensating for the time lag comprises utilizing an inverse low pass filter, wherein a time constant of the inverse low pass filter is equal to the time lag of the temperature sensor.

* * * * *